(12) United States Patent
Wang et al.

(10) Patent No.: US 11,416,047 B1
(45) Date of Patent: Aug. 16, 2022

(54) HEAT DISSIPATION SYSTEM OF PORTABLE ELECTRONIC DEVICE

(71) Applicants: Micro-Star International Co., Ltd., New Taipei (TW); MSI Computer (Shenzhen) Co., Ltd, Guangdong (CN)

(72) Inventors: Yu An Wang, New Taipei (TW); Chun Mo Wu, New Taipei (TW); Chih-Shiang Hsu, Taipei (TW); Wei En Kao, New Taipei (TW); Shuan-Cheng Su, New Taipei (TW); Kung Ming Shen, New Taipei (TW); Chia Chun Lin, New Taipei (TW); Chung-Bi Lee, Taoyuan (TW); Huan-Jung Lee, New Taipei (TW); Cheng-Lung Chen, New Taipei (TW); Chia Hao Yeh, New Taipei (TW)

(73) Assignees: Micro-Star International Co., Ltd., New Taipei (TW); MSI Computer (Shenzhen) Co., Ltd, Guangdong (CN)

( * ) Notice: Subject to any disclaimer, the term of this patent is extended or adjusted under 35 U.S.C. 154(b) by 0 days.

(21) Appl. No.: 17/316,731

(22) Filed: May 11, 2021

(30) Foreign Application Priority Data

Mar. 25, 2021 (TW) ................................. 110110801

(51) Int. Cl.
  *G06F 1/20* (2006.01)
  *H01L 23/427* (2006.01)
  *H05K 7/20* (2006.01)

(52) U.S. Cl.
  CPC ............ *G06F 1/203* (2013.01); *H01L 23/427* (2013.01); *H05K 7/2039* (2013.01)

(58) Field of Classification Search
  CPC ... H01L 23/427; H01L 2924/00; H01L 23/40; H05K 7/20336; H05K 7/20509;
  (Continued)

(56) References Cited

U.S. PATENT DOCUMENTS 7,325,590 B2 * 2/2008 Kim ....................... G06F 1/203
                                                    165/122
7,710,724 B2 * 5/2010 Takeguchi .............. G06F 1/203
                                                    165/122
(Continued)

FOREIGN PATENT DOCUMENTS

CN         1203746        5/2005
CN         102026522      4/2011
(Continued)

OTHER PUBLICATIONS

Anonymous, "laptops 101:understanding what goes into designing an efficient laptop colling solution", Aug. 2019, pp. 1-13. Available at: https://www.msi.com/blog/laptops-101-understanding-what-goes-into-designing-an-efficient-laptop-cooling-solution.
(Continued)

*Primary Examiner* — Michael A Matey
(74) *Attorney, Agent, or Firm* — JCIPRNET

(57) ABSTRACT

A heat dissipation system of a portable electronic device including a first processing element, a second processing element, a heat dissipation module located between the first processing element and the second processing element, a first heat transferring member, and a second heat transferring member, is provided. The first processing element has a first region and a second region. The first heat transferring member is in thermal contact with the first region, the second processing element, and the heat dissipation module. The second heat transferring member is in thermal contact with the second region and the heat dissipation module.

15 Claims, 2 Drawing Sheets

(58) Field of Classification Search
CPC ............. H05K 7/2039; H05K 7/20254; H05K 7/20518; G06F 1/203; G06F 1/20; G06F 1/206; F28D 15/0275; F28D 15/0266; G09G 2360/06

See application file for complete search history.

(56) References Cited

U.S. PATENT DOCUMENTS

| | | | | |
|---|---|---|---|---|
| 7,990,713 | B2* | 8/2011 | Liu | H01L 23/427 |
| | | | | 165/104.33 |
| 9,292,058 | B2* | 3/2016 | Demange | H05K 7/20809 |
| 9,332,672 | B2* | 5/2016 | Horng | H05K 7/20163 |
| 9,459,669 | B2* | 10/2016 | Hrehor, Jr. | H05K 7/20336 |
| 2004/0105233 | A1* | 6/2004 | Lai | H05K 7/202 |
| | | | | 361/695 |
| 2005/0225942 | A1* | 10/2005 | Lee | G06F 1/203 |
| | | | | 361/700 |
| 2007/0267172 | A1* | 11/2007 | Hwang | H01L 23/467 |
| | | | | 257/E23.099 |
| 2008/0101024 | A1* | 5/2008 | Lu | G06F 1/203 |
| | | | | 361/699 |
| 2009/0103262 | A1 | 4/2009 | Hata | |
| 2010/0151631 | A1 | 6/2010 | Pu et al. | |
| 2010/0195280 | A1* | 8/2010 | Huang | G06F 1/203 |
| | | | | 361/696 |
| 2010/0220439 | A1 | 9/2010 | Qin | |
| 2010/0296238 | A1* | 11/2010 | Mowry | G06F 1/206 |
| | | | | 361/679.53 |
| 2010/0296250 | A1* | 11/2010 | Huang | H05K 7/20518 |
| | | | | 165/104.26 |
| 2011/0075370 | A1* | 3/2011 | Abe | H01L 23/427 |
| | | | | 165/138 |
| 2012/0069521 | A1* | 3/2012 | Hwang | H01L 23/427 |
| | | | | 165/104.26 |
| 2014/0015106 | A1 | 1/2014 | Hsieh et al. | |
| 2017/0196122 | A1* | 7/2017 | Chen | G06F 1/1681 |
| 2017/0199554 | A1* | 7/2017 | Chen | H01L 23/38 |
| 2019/0045656 | A1* | 2/2019 | Chen | H05K 7/2039 |
| 2020/0081506 | A1 | 3/2020 | Morino et al. | |

FOREIGN PATENT DOCUMENTS

| | | | |
|---|---|---|---|
| CN | 209497790 U | * | 10/2019 |
| TW | 200910070 | | 3/2009 |

OTHER PUBLICATIONS

Horton Steve, "How do I choose the Right CPU for my PC?", Feb. 2011, pp. 1-3. Available at: https://www.reviversoft.com/blog/2011/02/how-do-i-choose-the-right-cpu-for-my-pc.

"Search Report of Europe Counterpart Application", dated Nov. 24, 2021, pp. 1-12.

Office Action of Taiwan Counterpart Application, dated Dec. 15, 2021, pp. 1-4.

* cited by examiner

HEAT DISSIPATION SYSTEM OF PORTABLE ELECTRONIC DEVICE

CROSS-REFERENCE TO RELATED APPLICATION

This application claims the priority benefit of Taiwan application serial no. 110110801, filed on Mar. 25, 2021. The entirety of the above-mentioned patent application is hereby incorporated by reference herein and made a part of this specification.

BACKGROUND

Technical Field

This disclosure relates to a heat dissipation system, and in particular to a heat dissipation system of a portable electronic device.

Description of Related Art

In general, in order to prevent electronic elements inside a portable electronic device from overheating and causing temporary or permanent failure of the electronic elements, a fan is usually disposed on the electronic elements of the computer host which temperatures tend to increase such as the power supply, the central processing unit (CPU) and the graphics processing unit (GPU) to perform heat dissipation, so as to quickly remove the heat generated by the electronic elements during high-speed operation, thereby reducing the temperature of the electronic elements themselves.

However, in view of the current trend of shifting towards a lightweight and thin portable electronic device design, an internal space of the housing is constantly shrinking, thereby resulting in a tight arrangement of the electronic elements. At the same time, the fan configured for heat dissipation is also limited by the internal space of the housing, causing the heat dissipation capacity to be limited, thereby resulting in issues related to heat dissipation to become more serious.

SUMMARY

This disclosure provides a heat dissipation system of a portable electronic device, which provides a corresponding configuration between a heat pipe, a heat source, and a heat dissipation module, so as to provide heat diversion and buffer temporary storage.

The heat dissipation system of the portable electronic device of the disclosure includes a first processing element, a second processing element, a heat dissipation module, a first heat transferring member, and a second heat transferring member. The first processing element has a first region and a second region, the heat dissipation module is located between the first processing element and the second processing element, the first heat transferring member is in thermal contact with the first region, the second processing element and the heat dissipation module, and the second heat is in thermal contact with the second region and the heat dissipation module. The first processing element generates heat from the first region when the first processing element is in a first loading mode. The first processing element generates heat from the first region and the second region concurrently when the first processing element is in a second loading mode. The heat generated by the first processing element in the first loading mode is less than the heat generated in the second loading mode. The heat generated by the first region is transferred to the heat dissipation module and the second processing element through the first heat transferring member when the first processing element is in the first loading mode and the second processing element is not activated. The heat generated by the first region is transferred to the heat dissipation module and the second processing element through the first heat transferring member, and the heat generated by the second region is transferred to the heat dissipation module through the second heat transferring member when the first processing element is in the second loading mode and the second processing element is not activated.

Based on the above, in the heat dissipation system of the portable electronic device, the second heat transferring member is in thermal contact with the second region and the heat dissipation module through the first heat transferring member being in thermal contact with the first region of the first processing element, the second processing element, and the heat dissipation module, to enable the first heat transferring member and the second heat transferring member to be specifically configured between the first processing element, the second processing element, and the heat dissipation module, and to allow the second processing element to serve as a storage for the heat from the first processing element when it is not activated. For the first processing element, this configuration undoubtedly provides additional heat diversion and storage location, while reducing the burden of the heat dissipation module and delaying the rapid increase in the internal temperature of the portable electronic device, thereby improving heat dissipation capacity.

To make the abovementioned more comprehensible, several embodiments accompanied by drawings are described in detail as follows.

DESCRIPTION OF THE EMBODIMENTS

Figure 1:
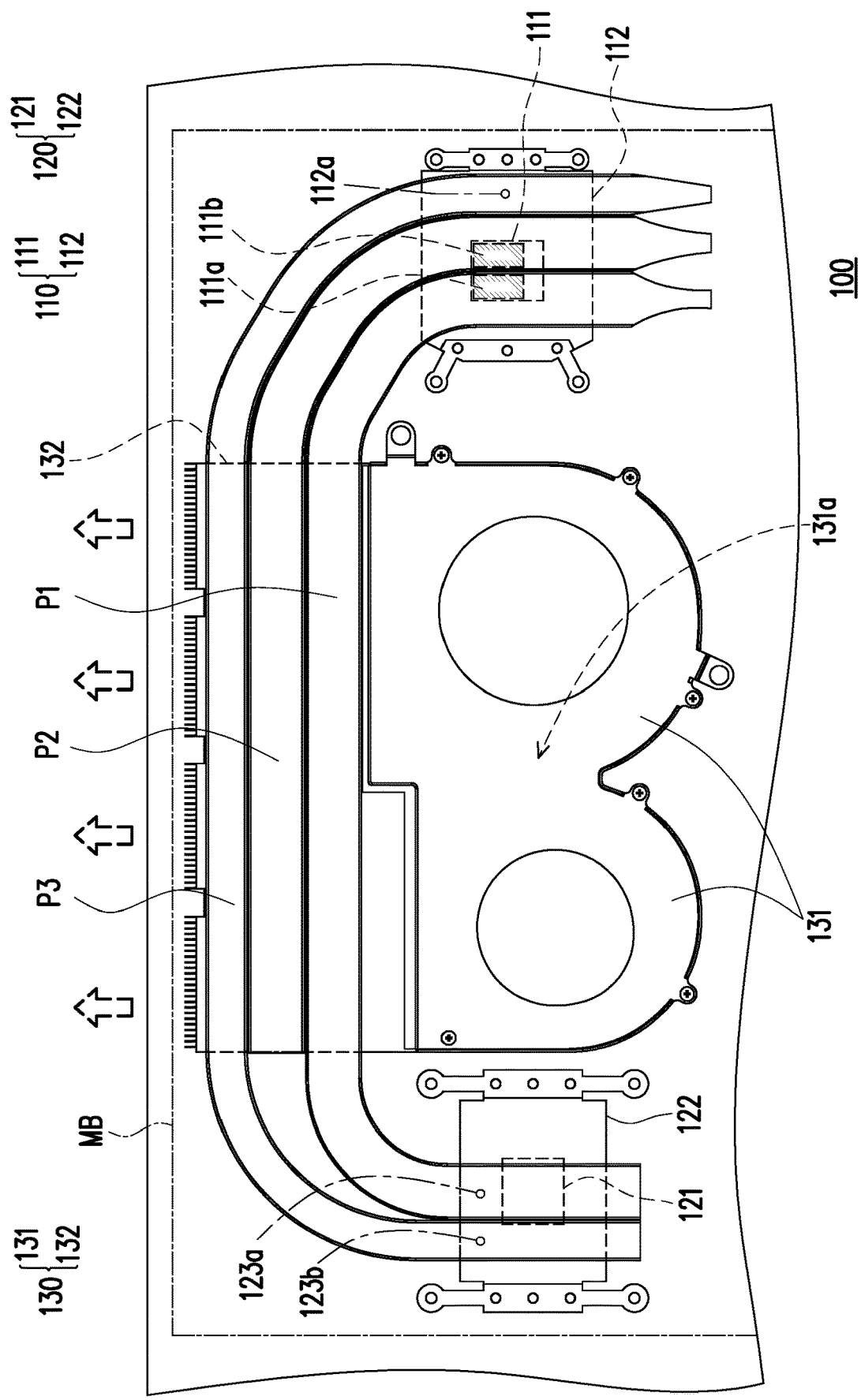
FIG. 1 is a schematic diagram of a heat dissipation system of a portable electronic device according to an embodiment of the disclosure.

FIG. 1 is a schematic diagram of a heat dissipation system of a portable electronic device according to an embodiment of the disclosure, in which only a portion of the portable electronic device is shown as an example. With reference to FIG. 1, in the embodiment, a heat dissipation system 100 of the portable electronic device includes a first processing element 110, a second processing element 120, a heat dissipation module 130, a first heat transferring member P1, and a second heat transferring member P2. The first processing element 110 has a first region 111a and a second region 111b, the heat dissipation module 130 is located between the first processing element 110 and the second processing element 120, and the first heat transferring member P1 is in thermal contact with the first region 111a, the second processing element 120 and the heat dissipation module 130, and the second heat transferring member P2 is in thermal contact with the second region 111b and the heat dissipation module 130, but is not in thermal contact with the second processing element 120. The first processing element 110 and the second processing element 120 are disposed on a circuit board MB of the portable electronic device, and the heat dissipation module 130 includes a fan 131 and a fin 132. Heat generated by the first processing element 110 and the second processing element 120 may be thermally transmitted to the heat dissipation module 130 to be further dissipated from the heat dissipation module 130 towards top of the figure, as shown by arrows in the figure. Furthermore, the heat transferring members described in this case, such as the foregoing first heat transferring member P1 and second heat transferring member P2, and those mentioned later, are composed of at least one heat pipe to serve in the transfer of heat, but the disclosure does not limit the type and the number of the heat pipe. It should also be noted that this embodiment does not limit the composition type and the number of the fin 132 and the fan 131 of the heat dissipation module 130, which may be appropriately adjusted according to a total amount of heat generated by the portable electronic device. For example, the heat dissipation module 130 of the embodiment is composed of two of the fan 131, and there is an opening 131a between the two fans 131 to facilitate exchange or convergence of air flow. In another embodiment that is not shown, a single fan with a larger flow rate and flow volume may also be provided.

To put it simply, a component layout of the embodiment is based on a premise as follows. A heat dissipation capacity of the heat dissipation module 130 is greater than a maximum heat that the first processing element 110 may generate, the heat dissipation capacity of the heat dissipation module 130 is greater than a maximum heat that the second processing element 120 may generate, but the heat dissipation capacity of the heat dissipation module 130 is less than a sum of the maximum heat generated by the first processing element 110 and the maximum heat generated by the second processing element 120. At the same time, in an actual operation state of the portable electronic device, the first processing element 110 and the second processing element 120 will not be in a heavy loading state concurrently. Therefore, under the above premise, the component layout in this case may enable diversion of the heat transfer. For example, a maximum generated power of the first processing element 110 is 35 W, a maximum generated power of the second processing element 120 is 35 W, and a heat removal (dissipation) capacity of the heat dissipation module 130 is 50 W. Therefore, the component layout as in the embodiment has to be performed to allow the heat transferring member (such as the first heat transferring member P1 and the second heat transferring member P2), the heat source (the first processing element 110 and the second processing element 120) and the heat dissipation module 130 to maintain a specific corresponding relationship to smoothly and appropriately combine the three foregoing with unequal capabilities, so as to allow the heat dissipation module 130 to perform heat dissipation smoothly.

Furthermore, in the embodiment, the first processing element 110 only generates heat from the first region 111a when the first processing element 110 is in a first loading mode. The first processing element 110 generates heat from the first region 111a and the second region 111b concurrently when the first processing element 110 is in a second loading mode. The heat generated by the first processing element 110 in the first loading mode is less than the heat generated in the second loading mode. The heat generated by the first region 111a is transferred to the heat dissipation module 130 and the second processing element 120 through the first heat transferring member P1 when the first processing element 110 is in the first loading mode and the second processing element 120 is not activated. The heat generated by the first region 111a is transferred to the heat dissipation module 130 and the second processing element 120 through the first heat transferring member P1, and the heat generated by the second region 111b is transferred to the heat dissipation module 130 through the second heat transferring member P2 when the first processing element 110 is in the second loading mode and the second processing element 120 is not activated.

As shown in FIG. 1, the first processing element 110 of the embodiment includes a die 111 and a body 112 (which includes an encapsulation structure and a heat conductive shell) that encapsulates and covers the die 111. Here, the first processing element 110 is a central processing unit (CPU) that has multiple cores and corresponds to at least one core in each of the first region 111a and the second region 111b of the die 111. Taking a dual core processor as an example, the processor has a first core (such as a core 0) and a second core (such as a core 1). The first core corresponds to the first region 111a shown in FIG. 1, and the second core corresponds to the second region 111b shown in FIG. 1. In general, the central processing unit only has to allow the first core to work when the computer system is performing word processing or other similar low-level functions, and the central processing unit allows the first core and the second core to work concurrently once the computer system has to perform multi-tasking or other similar high-level functions.

In the embodiment, the second processing element 120 is a graphics processing unit (GPU), which allows the first processing element 110 to perform switching of the second processing element 120 between a turned-on state and a turned-off state through a control means, such as Nvidia Optimus technology, so as to be energy-saving. In general, the first processing element 110 (CPU) is usually always in a running state and the second processing element 120 (GPU) may be turned on or off as required when the computer system is turned on. Therefore, there will not be a state in which the second processing element 120 is turned on but the first processing element 110 is turned off.

That is, as mentioned above, when performing the low-level functions, it is equivalent to the first processing element 110 only generating heat by the first region 111a, therefore it correspondingly activates the first heat transferring member P1 to transfer the heat to the heat dissipation module 130 and the second processing element 120. At this time, the second processing element 120 may smoothly absorb some of the heat transferred from the first processing element 110 if the second processing element 120 is in an inactive state. The inactive state of the second processing element 120 is, for example, achieved by the aforementioned technology. In other words, the second processing element 120 that is not activated at this time may be regarded as a heat diversion and storage target of the first processing element 110, and provides an additional region for heat storage, thereby equivalent to improving heat dissipation of the heat dissipation module 130.

With reference to FIG. 1 again, in the embodiment, the heat dissipation system 100 of the portable electronic device further includes a third heat transferring member P3, which is in thermal contact with a third region 112a of the first processing element 110, the heat dissipation module 130, and the second processing element 120. As compared with the foregoing first heat transferring member P1 and second heat transferring member P2, the third heat transferring member P3 does not have a direct thermal connection with the heat generation regions of the first processing element 110. In other words, the first region 111a and the second region 111b correspond to the die 111 of the first processing element 110, and the third region 112a corresponds to a part of the first processing element 110 without the die, which is equivalent to the third region 112a corresponding to a coreless part of the central processing unit (the first processing element 110). Therefore, as shown in FIG. 1, the first heat transferring member P1 and the third heat transferring member P3 are substantially located on two opposite sides of the second heat transferring member P2, which is equivalent to the second region 111b being located between the first region 111a and the third region 112a. On another side, the third heat transferring member P3 corresponds to a part of the second processing element 120 without a die, and this is also in respect to the first heat transferring member P1 corresponding to a die 121 of the second processing element 120. Here, the corresponding part of the first heat transferring member P1 may be regarded as a fourth region 123a, and the part without the die (the corresponding part of the third heat transferring member P3) may be regarded as a fifth region 123b. The fourth region 123a is adjacent to the fifth region 123b.

Based on the above, the heat dissipation system of the embodiment is enabled to provide heat diversion through the relative configuration of the first heat transferring member P1, the second heat transferring member P2, and the third heat transferring member P3, in which each has a specific positional relationship with the first processing element 110 and the second processing element 120. The first processing element 110 is in the first loading mode and the second loading mode, which are as described above. Then, when the first processing element 110 further generates more heat due to operation and is in a third loading mode, at this time, the heat generated by the first region 111a and the second region 111b has already spread throughout the entire structure of the first processing element 110. The first processing element 110 has an additional transfer path due to the configuration of the foregoing third heat transferring member P3, that is, heat is transmitted to the heat dissipation module 130 and the second processing element 120 through the third heat transferring member P3. At this time, not only is some of the heat of the third heat transferring member P3 dissipated by the heat dissipation module 130, the remaining heat is mainly transferred to the second processing element 120 to allow temperatures of the first processing element 110 and the second processing element 120 to be the same. For the first processing element 110, this action is equivalent to providing an additional cooling path. Here, the heat generated by the first processing element 110 in the third load mode is greater than the heat generated by the first processing element 110 in the second loading mode, and greater than a sum of heat transferring capacities of the first heat transferring member P1 and the second heat transferring member P2.

The above are heat transferring characteristics of the heat dissipation system of the embodiment with regards to the first processing element 110 in the different loading modes. A boundary between the first loading mode and the second loading mode is when the power generated by the first processing element 110 is 40% of the maximum power of the first processing element 110.

On the other hand, with regards to the second processing element 120, when it is in a fifth loading mode, which is equivalent to when the power of the second processing element 120 is 0-15% of its maximum power, in view of the foregoing first processing element 110 is always in a running state, and the temperature and the power of the first processing element 110 are generally lower than those of the second processing element 120, therefore the heat generated by the second processing element 120 may be transferred to the dissipation module 130 and the first processing element 110 through the first heat transferring member P1. However, at this time, for the first heat transferring member P1, heat transferring directions of two opposite ends of the heat transferring member P1 are opposite. Therefore, it is not easy to generate heat transfer, and easy to quickly accumulate heat at the same time, which allows the second processing element 120 to switch to a fourth loading mode (that is, the power of the second processing element 120 reaches more than 15% of its maximum power). At this time, not only is the heat generated by the second processing element 120 being transferred to the heat dissipation module 130 through the first heat transferring member P1, heat generated by the die 121 is also transferred to a body 122 of the second processing element 120 (the body 122 encapsulates and covers the die 121), therefore the third heat transferring member P3 may be further activated, so as to transfer the heat to the heat dissipation module 130 via the second heat transferring member P2 after it is transferred to the first processing element 110 via the third heat transferring member P3.

Here, the heat generated by the second processing element 120 in the fifth loading mode is less than the heat generated in the fourth loading mode, and the heat generated by the second processing element 120 in the fifth loading mode is transferred to the heat dissipation module 130 and the first processing element 110 through the first heat transferring member P1 only. In addition, due to the presence of the second heat transferring member P2, the heat generated by the second processing element 120 in the fourth loading mode 4 is further transferred to the heat dissipation module 130 through the second heat transferring member P2, after it is transferred to the first processing element 110 through the first heat transferring member P1 and the third heat transferring member P3, so as to prevent rapid increase in temperature due to heat accumulation at the first processing element 110.

Figure 2:
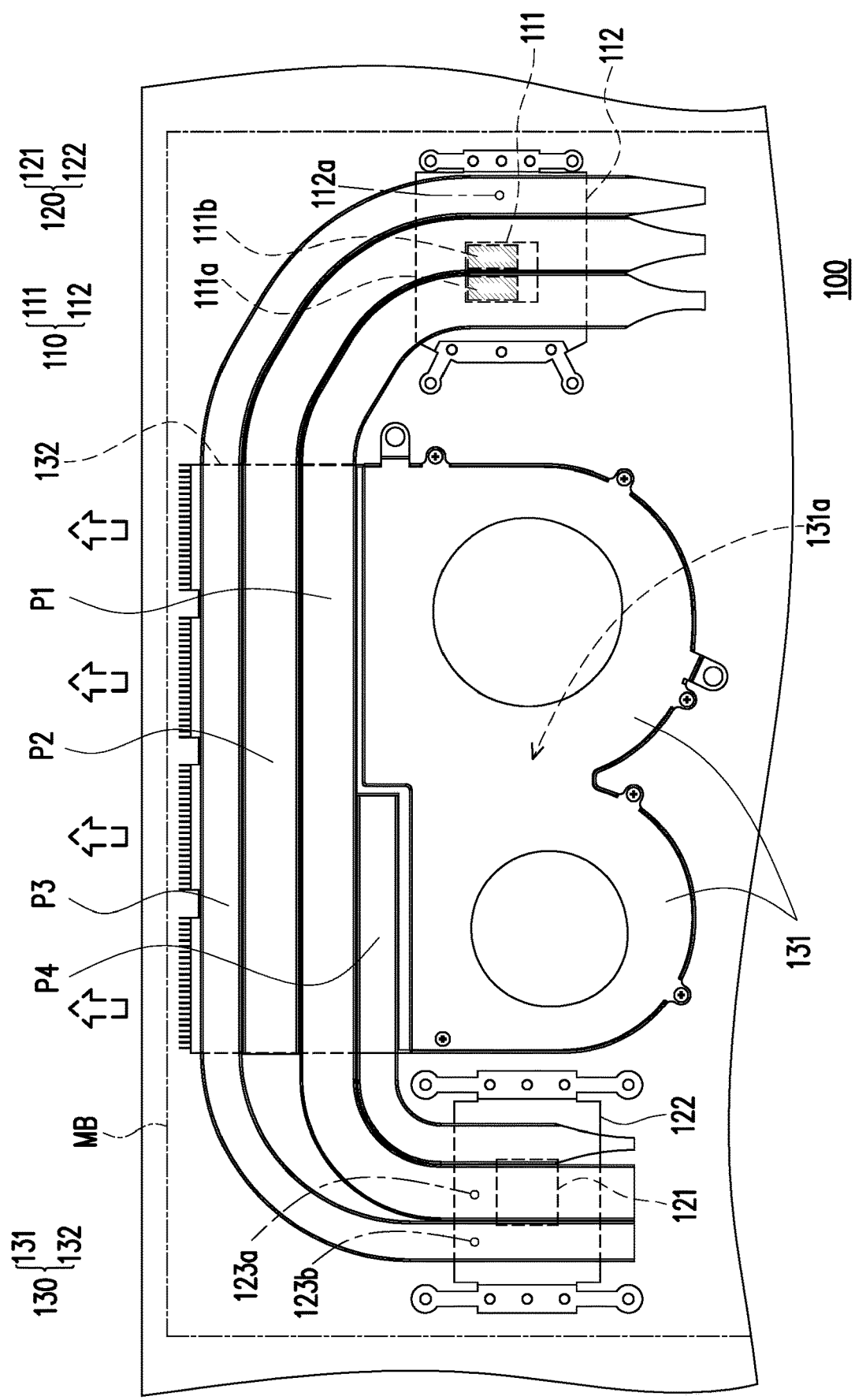
FIG. 2 is a schematic diagram of a heat dissipation system of a portable electronic device according to another embodiment of the disclosure.

FIG. 2 is a schematic diagram of a heat dissipation system of a portable electronic device according to another embodiment of the disclosure. With reference to FIG. 2, the embodiment may be regarded as the previous embodiment with a partial amendment, that is, a fourth heat transferring member P4 is added to the heat dissipation system, which is in thermal contact with the second processing element 120 and the heat dissipation module 130. Furthermore, two opposite ends of the fourth heat transferring member P4 respectively correspond to the part of the second processing element 120 without the die and the fin 132. Here, the fourth heat transferring member P4 is configured to transfer the heat at the second processing element 120 to the heat dissipation module 130, and the heat at the second processing element 120 may be generated by the second processing element 120 itself or transmitted by the first processing element 110 through the first heat transferring member P1. The disclosure does not limit the source of heat at the second processing element 120 here.

In summary, in the above embodiments of the disclosure, in the heat dissipation system of the portable electronic device, the second heat transferring member is in thermal contact with the second region and the heat dissipation module through the first heat transferring member being in thermal contact with the first region of the first processing element, the second processing element and the heat dissipation module, to enable the first heat transferring member and the second heat transferring member to be specifically configured between the first processing element, the second processing element, and the heat dissipation module, and to allow the first processing element and the second processing element to be a temporary heat storage region for each other. By providing an additional heat storage region, the first processing element or the second processing element does not accumulate heat.

For example, the second processing element may serve as a storage for the heat from the first processing element when the second processing element is not activated. For the first processing element, this configuration undoubtedly provides additional heat diversion and storage location, while reducing the burden of the heat dissipation module and delaying the rapid increase in the internal temperature of the portable electronic device, thereby improving heat dissipation capacity. At the same time, due to the existence of the third heat transferring member, the heat may be further transferred to the heat dissipation module via the second heat transferring member, after the heat is transferred to the first processing element through the third heat transferring member once the heat at the second processing element is excessive.

In this way, the above heat transferring path effectively prevents the heat from staying and accumulating in a specific location, and prevents a state in which the temperature of the electronic component increases rapidly. Furthermore, through the above component layout, this is sufficient to allow the heat dissipation module with a lower heat removal (dissipation) capacity to perform heat dissipation smoothly on a processing element with higher heat generation.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A heat dissipation system of a portable electronic device, comprising:
   a first processing element, having a first region and a second region;
   a second processing element;
   a heat dissipation module, located between the first processing element and the second processing element;
   a first heat transferring member, in thermal contact with the first region, the second processing element and the heat dissipation module; and
   a second heat transferring member, in thermal contact with the second region and the heat dissipation module;
   wherein the first processing element generates heat from the first region when the first processing element is in a first loading mode, the first processing element generates heat from the first region and the second region concurrently when the first processing element is in a second loading mode, and the heat generated by the first processing element in the first loading mode is less than the heat generated in the second loading mode,
   the heat generated by the first region is transferred to the heat dissipation module and the second processing element through the first heat transferring member when the first processing element is in the first loading mode and the second processing element is not activated,
   the heat generated by the first region is transferred to the heat dissipation module and the second processing element through the first heat transferring member, and the heat generated by the second region is transferred to the heat dissipation module through the second heat transferring member when the first processing element is in the second loading mode and the second processing element is not activated.

2. The heat dissipation system of the portable electronic device according to claim 1, further comprising:
   a third heat transferring member, in thermal contact with a third region of the first processing element, the heat dissipation module and the second processing element, wherein the first region and the second region corresponds to a die of the first processing element, and the third region corresponds to a part of the first processing element without the die.

3. The heat dissipation system of the portable electronic device according to claim 2, wherein the first processing element is a central processing unit (CPU) that has a plurality of cores, the first region and the second region each correspond to at least one of the cores, and the third region corresponds to a part of the central processing unit without the cores.

4. The heat dissipation system of the portable electronic device according to claim 2, wherein the second region is located between the first region and the third region, and the second heat transferring member is located between the first heat transferring member and the third heat transferring member.

5. The heat dissipation system of the portable electronic device according to claim 2, wherein the first heat transferring member is in thermal contact with a fourth region of the second processing element, and the third heat transferring member is in thermal contact with a fifth region of the second processing element, the fourth region corresponds to a die of the second processing element, and the fifth region corresponds to a part of the second processing element without the die.

6. The heat dissipation system of the portable electronic device according to claim 5, wherein the fourth region is adjacent to the fifth region.

7. The heat dissipation system of the portable electronic device according to claim 2, wherein heat generated by the first processing element in a third loading mode is greater than the heat generated by the first processing element in the second loading mode and greater than a sum of heat transferring capabilities of the first heat transferring member and the second heat transferring member, the heat generated by the first processing element in the third loading mode is respectively transferred to the second processing element via the first heat transferring member and the third heat transferring member, and transferred to the heat dissipation module via the second heat transferring member.

8. The heat dissipation system of the portable electronic device according to claim 2, wherein heat generated by the second processing element is transferred to the heat dissipation module via the first heat transferring member, and is also transferred to the heat dissipation module through the second heat transferring member, after being transferred to the first processing element via the third heat transferring member, when the second processing element is in a fourth loading mode.

9. The heat dissipation system of the portable electronic device according to claim 8, wherein heat generated by the second processing element in a fifth loading mode is less than the heat generated in the fourth loading mode, and the heat generated by the second processing element in the fifth loading mode is transferred to the heat dissipation module and the first processing element through the first heat transferring member only.

10. The heat dissipation system of the portable electronic device according to claim 9, a boundary between the fourth loading mode and the fifth loading mode of the second processing element is when power generated by the second processing element is 15% of a maximum power of the second processing element.

11. The heat dissipation system of the portable electronic device according to claim 2, wherein the heat dissipation module is located between the first processing element and the second processing element on a heat transferring path of the third heat transferring member.

12. The heat dissipation system of the portable electronic device according to claim 1, wherein the second processing element is a graphics processing unit (GPU).

13. The heat dissipation system of the portable electronic device according to claim 1, wherein a heat dissipation capacity of the heat dissipation module is greater than a maximum heat generated by the first processing element, the heat dissipation capacity of the heat dissipation module is greater than a maximum heat generated by the second processing element, and the heat dissipation capacity of the heat dissipation module is less than a sum of the maximum heat generated by the first processing element and the maximum heat generated by the second processing element.

14. The heat dissipation system of the portable electronic device according to claim 1, wherein a boundary between the first loading mode and the second loading mode is when power generated by the first processing element is 40% of a maximum power of the first processing element.

15. The heat dissipation system of the portable electronic device according to claim 1, wherein the heat dissipation module is located between the first processing element and the second processing element on a heat transferring path of the first heat transferring member.

\* \* \* \* \*